(12) United States Patent
Wang et al.

(10) Patent No.: US 6,784,458 B1
(45) Date of Patent: Aug. 31, 2004

(54) RANDOM PARTITIONABLE DOT MATRIX LED DISPLAY

(75) Inventors: Bily Wang, Hsin-Chu (TW); Jonnie Chuang, Taipei (TW)

(73) Assignee: Harvatek Corp., Hsinchu (TW)

( * ) Notice: Subject to any disclaimer, the term of this patent is extended or adjusted under 35 U.S.C. 154(b) by 0 days.

(21) Appl. No.: 10/412,764

(22) Filed: Apr. 14, 2003

(51) Int. Cl.$^7$ .............................................. H01L 27/15
(52) U.S. Cl. .............................. 257/79; 257/59; 257/88; 257/72
(58) Field of Search .............................. 257/59–300, 13

(56) References Cited

U.S. PATENT DOCUMENTS

| | | | |
|---|---|---|---|
| 4,284,001 A | * | 8/1981 | Liontiades |
| 6,252,562 B1 | * | 6/2001 | Diez |
| 6,262,531 B1 | * | 7/2001 | Inoguchi et al. ............ 313/506 |
| 6,583,791 B2 | * | 6/2003 | Berryman et al. |

* cited by examiner

*Primary Examiner*—Fetsum Abraham
(74) *Attorney, Agent, or Firm*—H. C. Lin

(57) ABSTRACT

An array of light emitting diodes (LED) are laid out as a dot matrix array as a display panel. Each LED is accessed by two dimensional addressing from a first set of parallel horizontal interconnections and a second set of orthogonal interconnections. The two sets of orthogonal interconnections are printed on two sides of a substrate. One of the two electrodes of an LED, which mounted on the top of the substrate, is fed through the substrate with a via hole and connected to the orthogonal interconnection at the bottom of the substrate. The size of the display panel is configurable by removing certain rows and/or columns. More than one partitioned blocks can be pieced together by aligning and coupling the corresponding orthogonal interconnections through a motherboard.

9 Claims, 10 Drawing Sheets

X2

Y2

RANDOM PARTITIONABLE DOT MATRIX LED DISPLAY

BACKGROUND OF THE INVENTION (1) Field of the Invention

This invention relates to light emitting diodes (LED), in particular to LED displays.

(2) Brief Description of Related Art

FIG. 1 shows a prior art 8×8 LED display panel. The two electrodes of each LED is coupled to a pair of soldering pads which are mounted on a substrate 01. Each soldering pad is connected by printed wiring 05 to plated-through holes 04 for connection to the bottom side of the substrate 01. Such printed wiring 05 have irregular pattern printed on the substrate 01.

FIG. 2 shows the bottom side of the substrate 01, again showing the irregularity of the wiring pattern.

The irregularity of the layout does not allow for design flexibility. When the dimension of the display panel is changed, a new layout must be patterned. The mating between the LED display panel and the motherboard does not follow any regular rule, and makes it more difficult to test. If any one of the LEDs is defective, the whole display panel must be discarded.

SUMMARY OF THE INVENTION

An object of this invention is to provide a LED display panel, which is partitionable and configurable to different number of pixels. Another object of this invention is to disable any defective LED in a display panel. Still another object of this invention is to provide a LED display panel, which can easily be tested.

These objects are achieved by arranging the LEDs of a display as a matrix array. The metal interconnections for accessing the LEDs of the matrix array are laid out as vertical columns and horizontal rows as in a two-dimensional random access memory array. These matrix array can be cut and partitioned to reduce the number of pixels of the display panel, or be expanded to increase the number of pixels. The partitioned sub-arrays can be pieced together by aligning the corresponding interconnections and connecting them through a motherboard. Any defective LED in the array can be inactivated by not accessing the particular defective LED. The LEDs can be mounted on plated-through holes to reach the opposite side of the substrate for surface mounting to a motherboard.

DETAILED DESCRIPTION OF THE INVENTION

Figure 1:
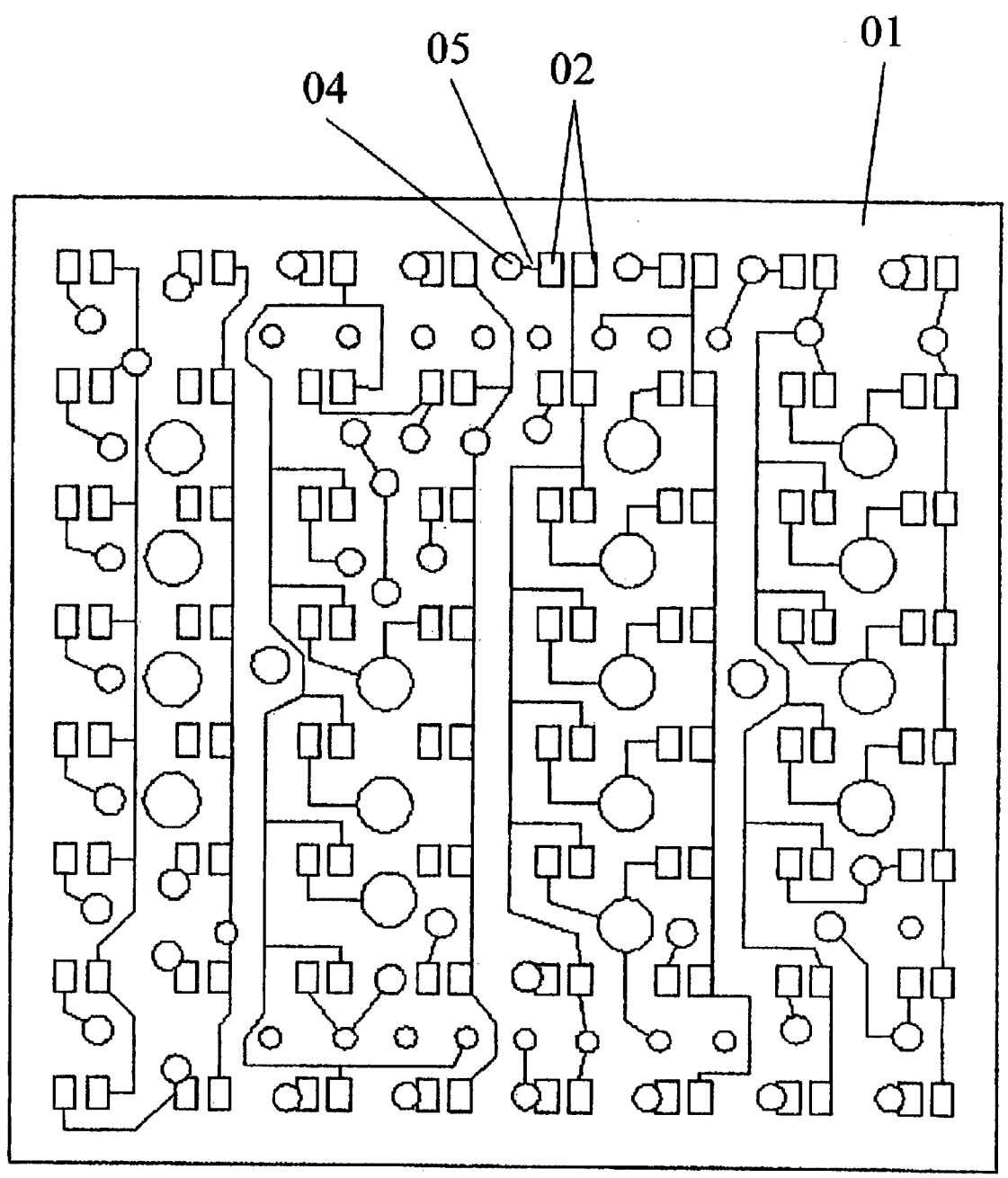
FIG. 1 shows an irregular wiring pattern of a prior art LED display panel.
Figure 2:
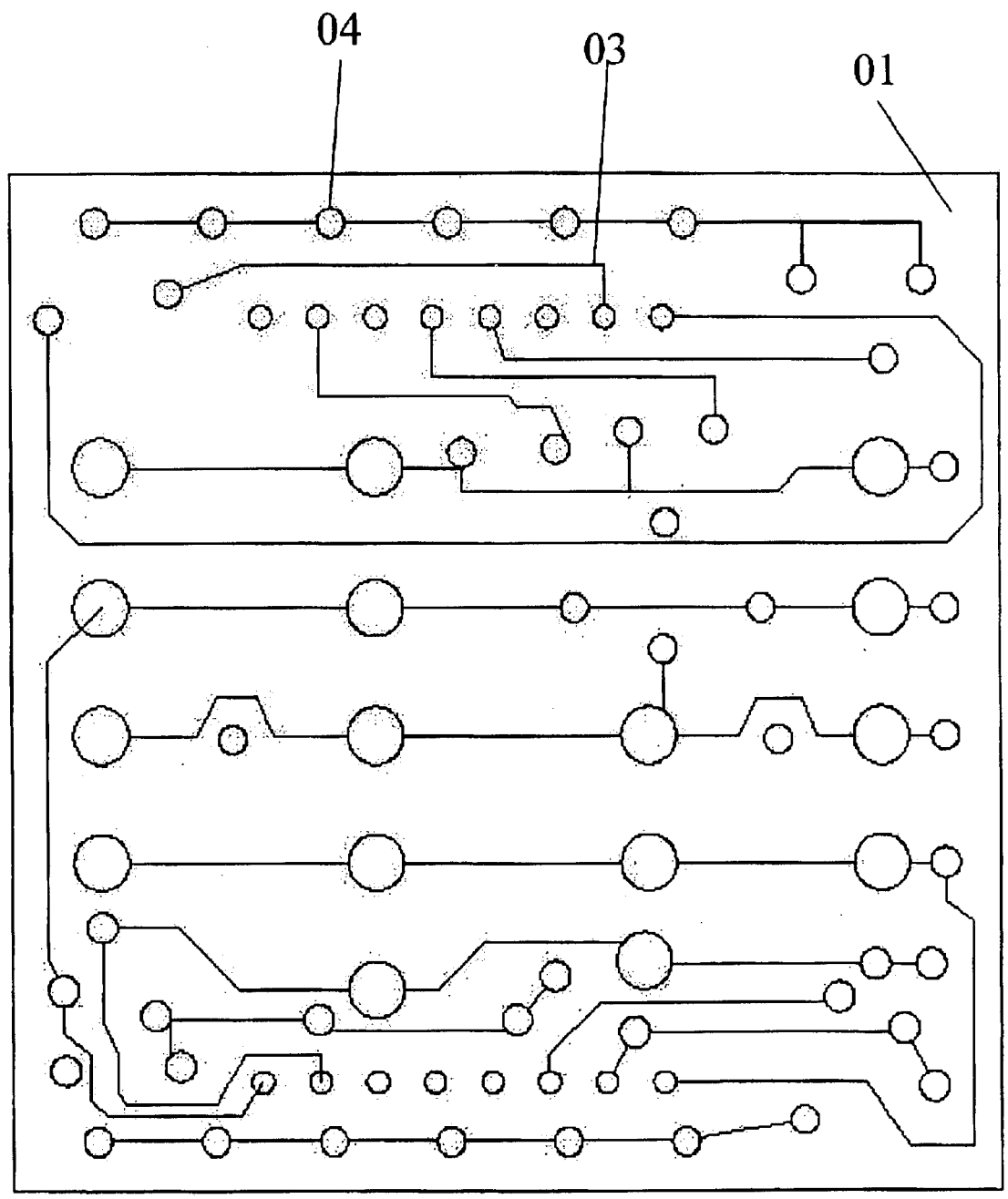
FIG. 2 shows the irregular wiring pattern at the bottom side of the prior art LED shown in FIG. 1.
Figure 3:
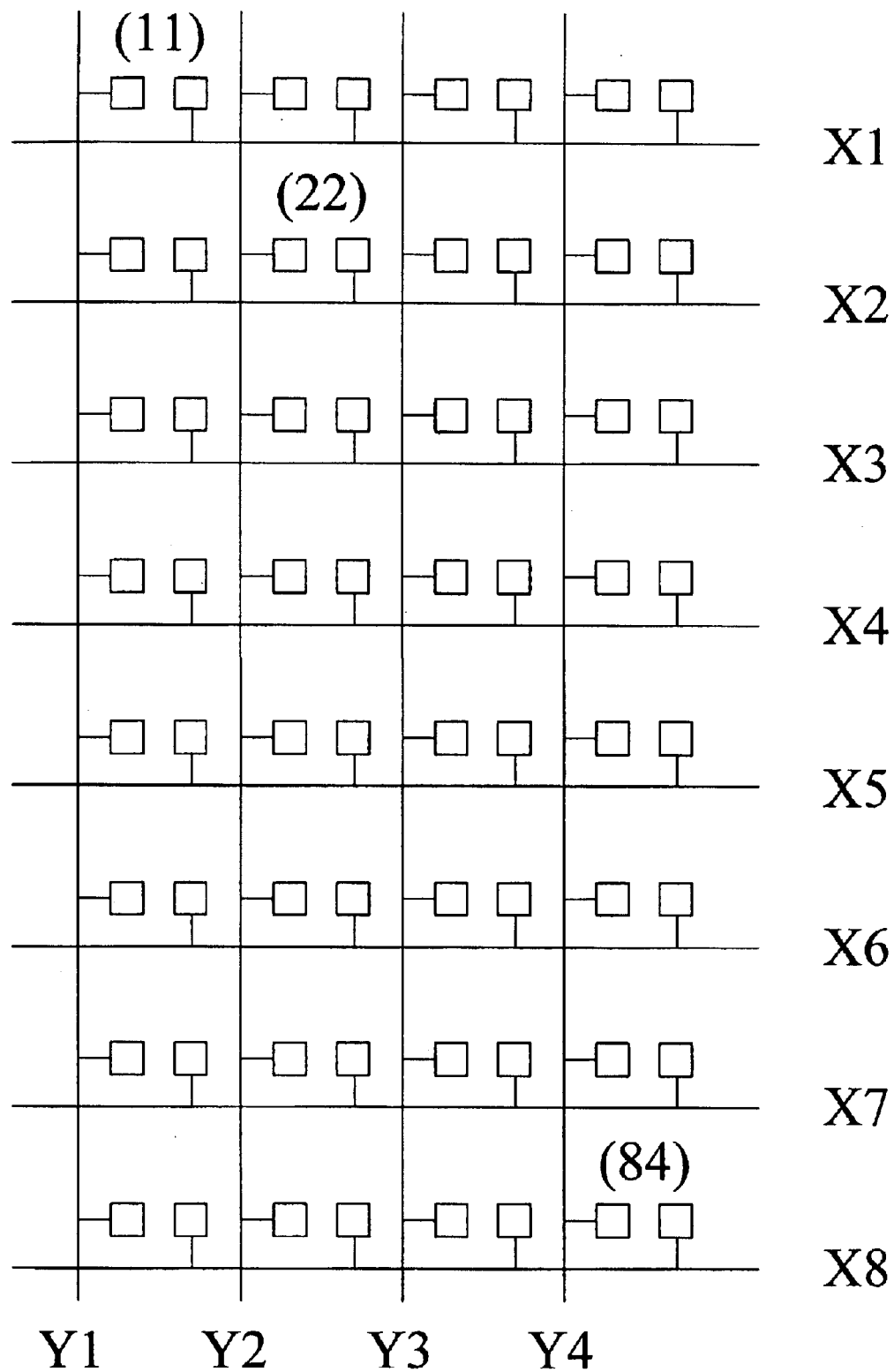
FIG. 3 shows the basic layout of the configurable LED matrix array display panel based on the present invention.

FIG. 3 shows the basic layout of the LED matrix array. As an example, an 8×4 LED matrix is shown. An LED is placed near each cross-point of rows of interconnections X1, X2, . . . X8, and columns of interconnections Y1, Y2, . . . Y4. Each LED is mounted on one or two soldering pads at the cross-point of the orthogonal interconnections. A common metal interconnections X1, X2, X8 is connected to each right hand soldering pad on the same row. Similarly, a common metal interconnections Y1, Y2, . . . Y4 is connected to left hand soldering pad on the same column. The X-interconnections and the Y-interconnections are insulated from each other. A particular LED is activated by coincident addressing. For, instance, the LED (11) is activated when row X1 and column Y1 are energized coincidentally; the LED (22) is activated when row X2 and column Y2 are activated coincidentally; the LED (84) is activated when row X8 and column Y4 are activated coincidentally; etc.

Figure 4:
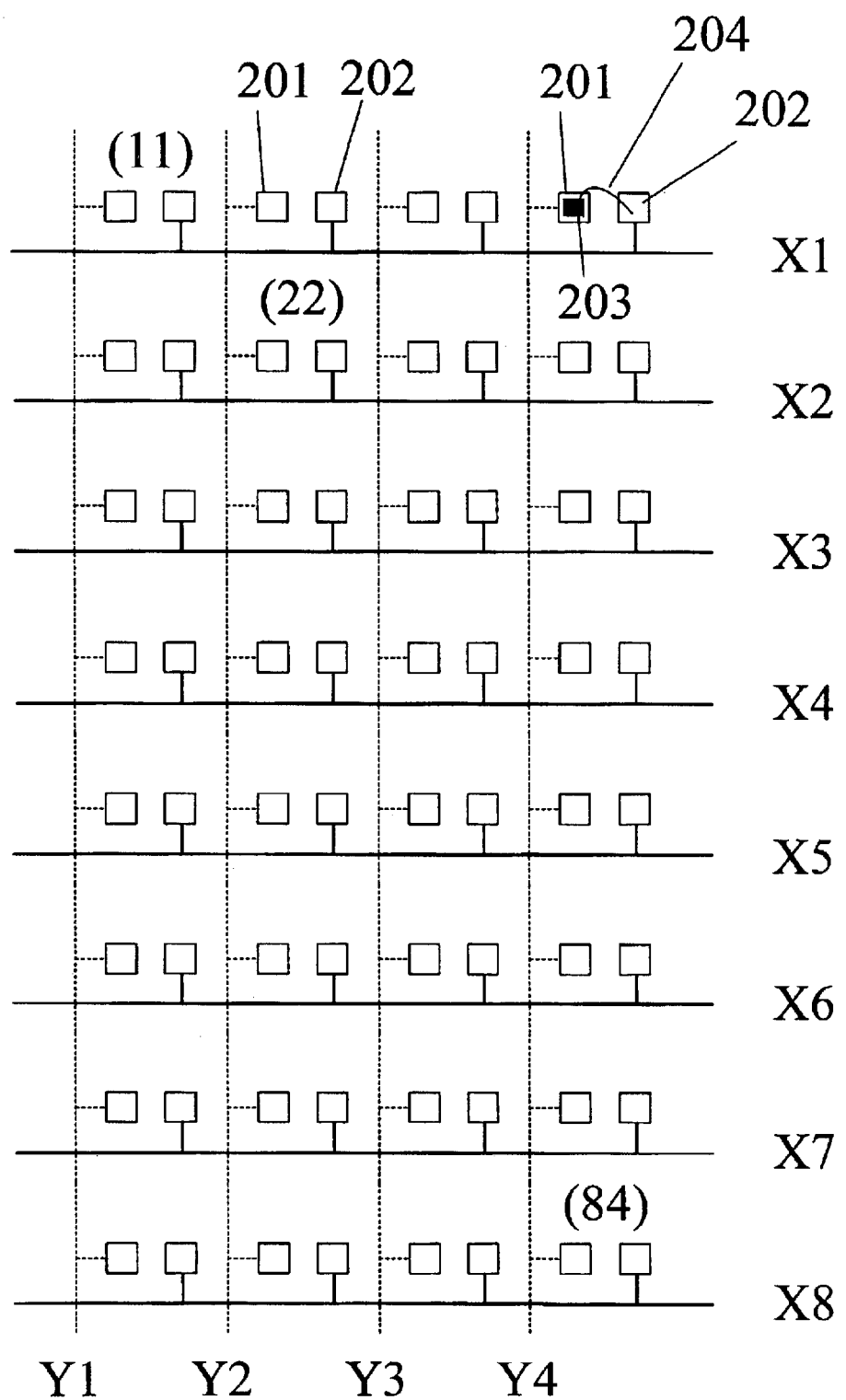
FIG. 4 shows the mounting of the LEDs on the soldering pads laid out according to FIG. 3.

FIG. 4 shows how the horizontal interconnections X1, X2, . . . X8 are insulated from the vertical interconnections Y1, Y2, . . . Y4. As shown, the vertical lines Y1, Y2, . . . Y4 are printed on the bottom of the substrate shown as dotted lines. An LED 203 is mounted on the left hand soldering pad 201, which is plated through the substrate to contact the wiring at the bottom side and be connected to the common vertical interconnection Y4. The top electrode of the LED 203 is wire bonded to the right bonding pad 202, which is connected to a common horizontal interconnection X1. Thus, each LED at a cross-point can be activated at random. If the LED has two bottom electrodes, both bottom electrodes can rest over the two soldering pads as a flip-chip.

Figure 5:
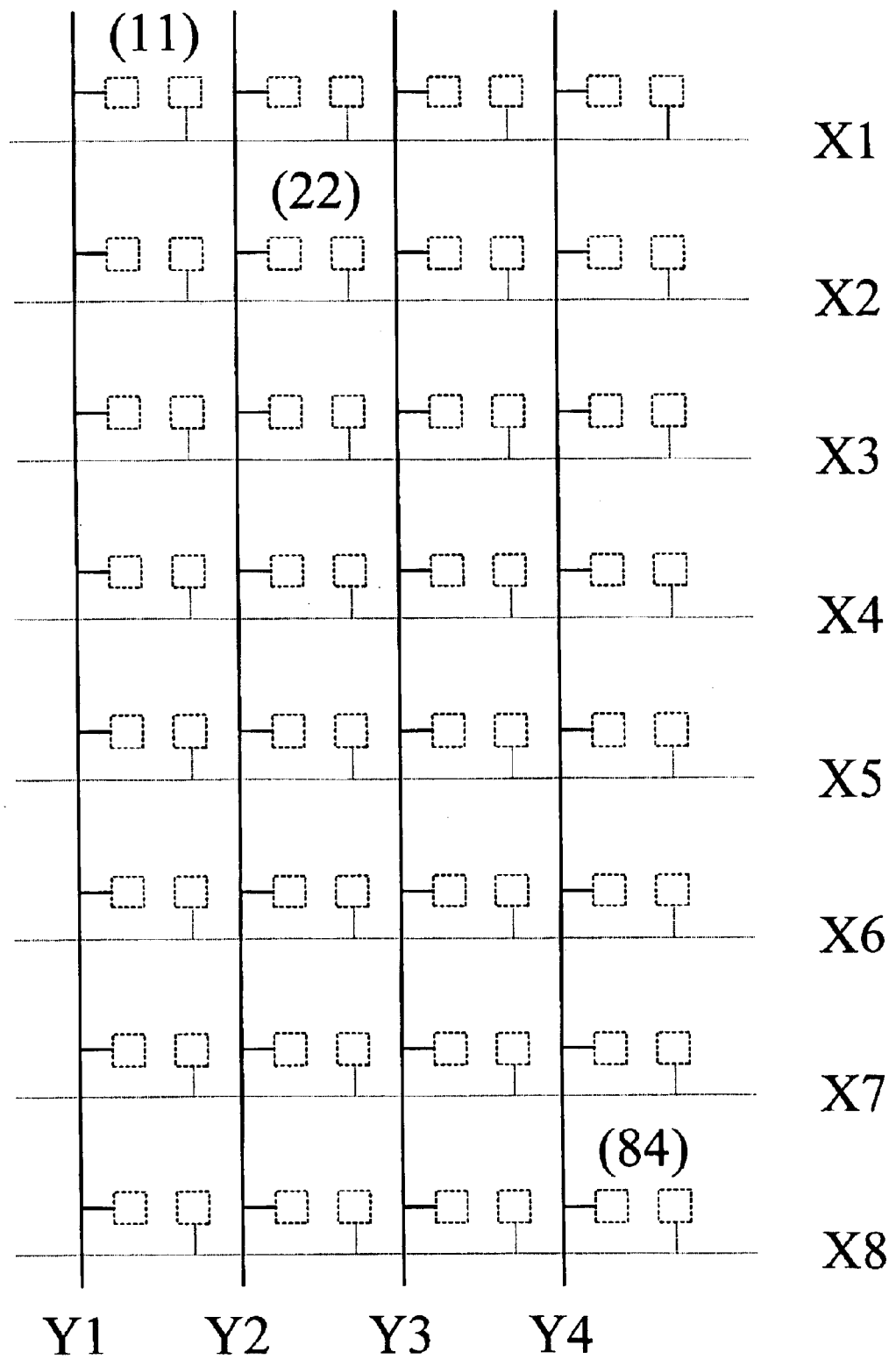
FIG. 5 shows the perspective view of the bottom side of the LED display panel shown in FIG. 3.

FIG. 5 shows the perspective view of the bottom side of the substrate shown in FIG. 4. The LEDs (11), (22) and (84) can be activated as explained in connection with FIG. 3. Such a regular layout pattern is amendable to partitioning. When such an array is cut for partitioning, more than one partitioned blocks can be pieced together to form a larger display panel. By aligning the corresponding interconnections either horizontally or vertically, the continuity of the interconnections can be preserve. During application, different horizontal interconnections or vertical interconnections of the partitioned blocks can be extended by coupling through an underlying motherboard, thus increasing the design flexibility.

Figure 6:
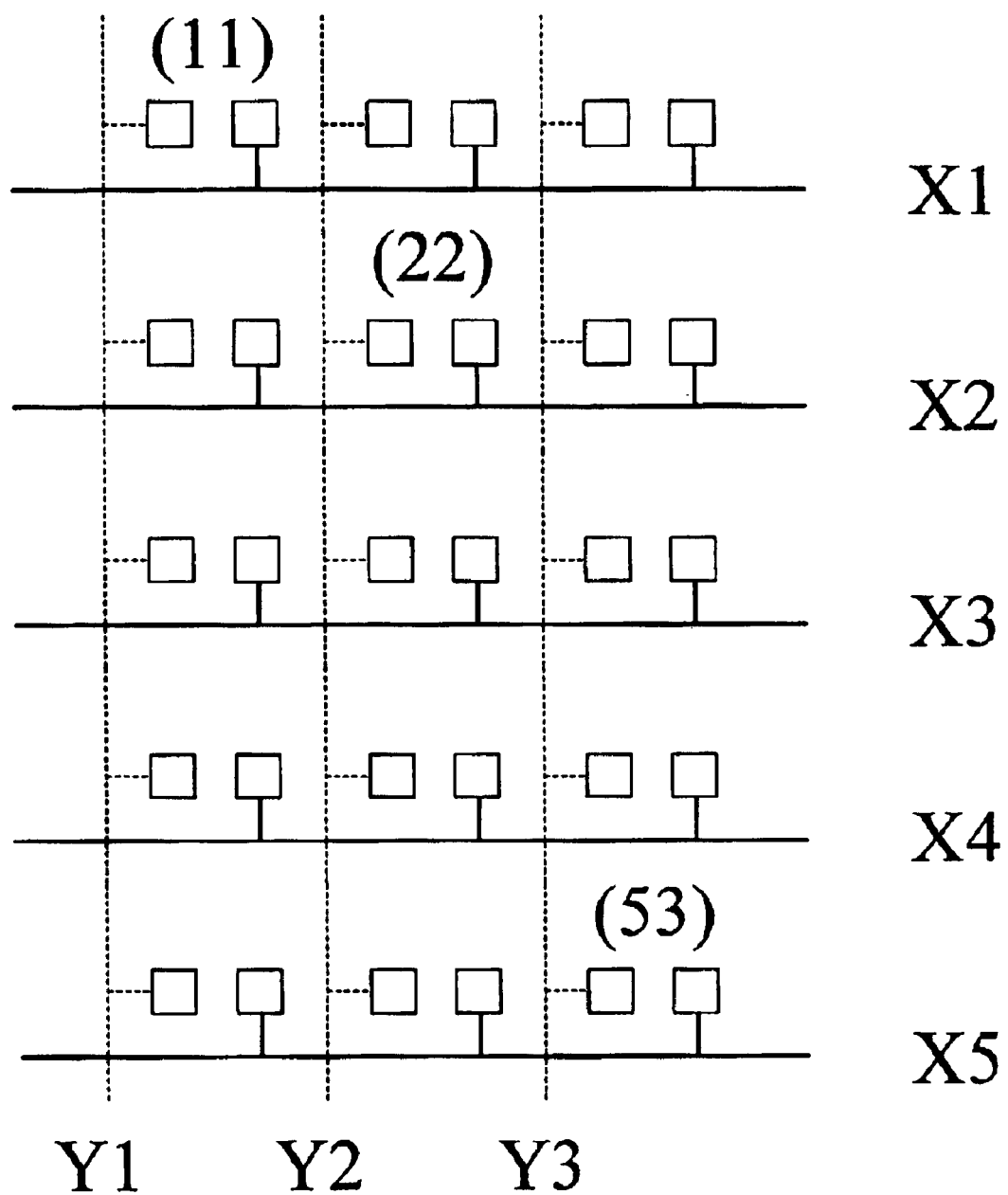
FIG. 6 shows the layout of a reduced-size LED sub-matrix array.

FIG. 6 shows how the 8×4 LED matrix array shown in FIG. 4 is reduced to a 5×3 LED matrix array by cutting off three horizontal rows X6, X7 and X8 and vertical columns Y4. The layout of the remaining LED matrix array is the same as the 8×4 LED matrix. Therefore, there is no need to redesign the layout. The LEDs (11), (22) and (53) can be energized by coincident addressing as explained in connection with FIG. 3.

Figure 7:
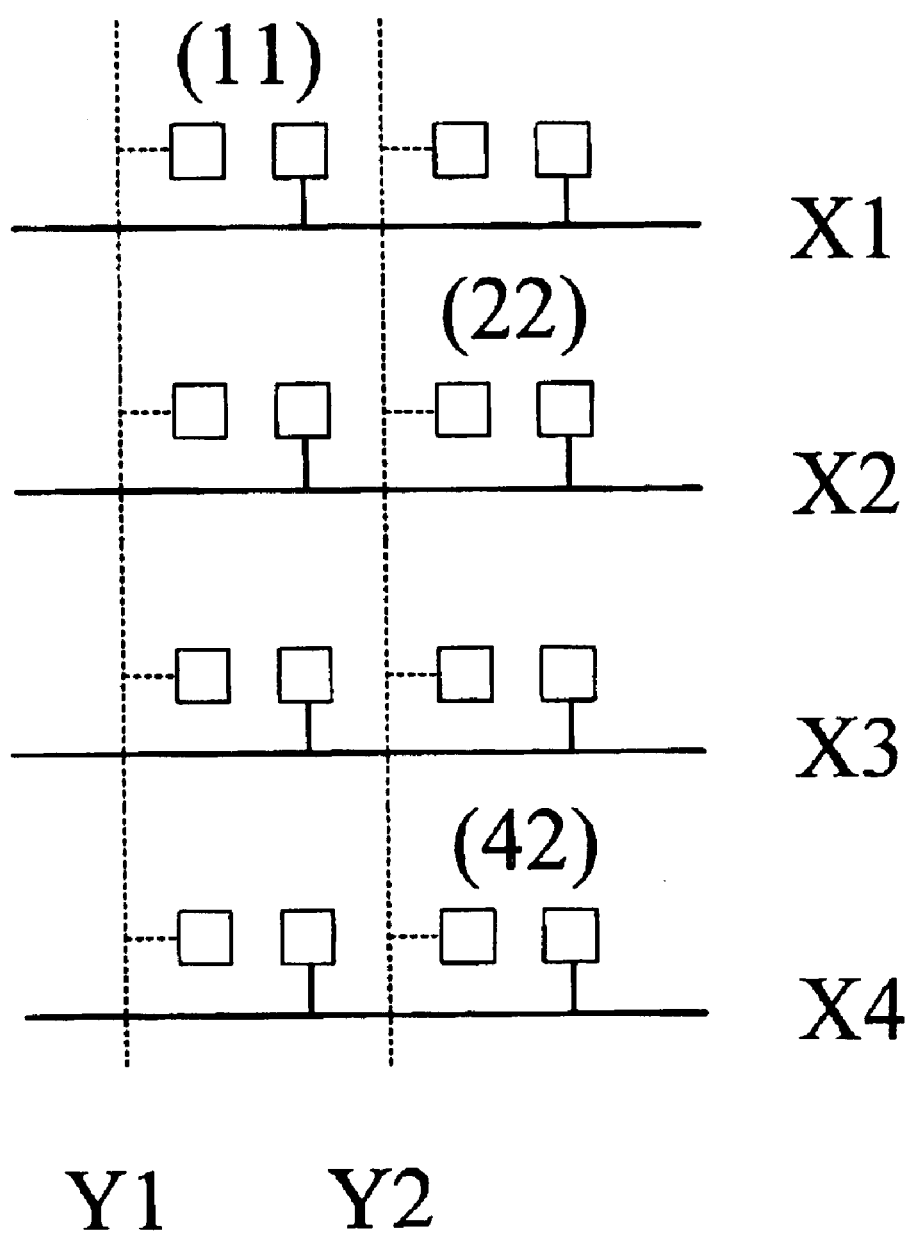
FIG. 7 shows the layer out of a LED sub-matrix array further reduced than FIG. 6.

FIG. 7 shows a further reduction of the LED matrix array to a 4×2 matrix array with only four horizontal rows X1, X2, X3, X4 and two columns Y1, Y2. As in FIGS. 3 and 6, the LEDs (11), (22) and (42) can be energized by coincident addressing.

Figure 8:
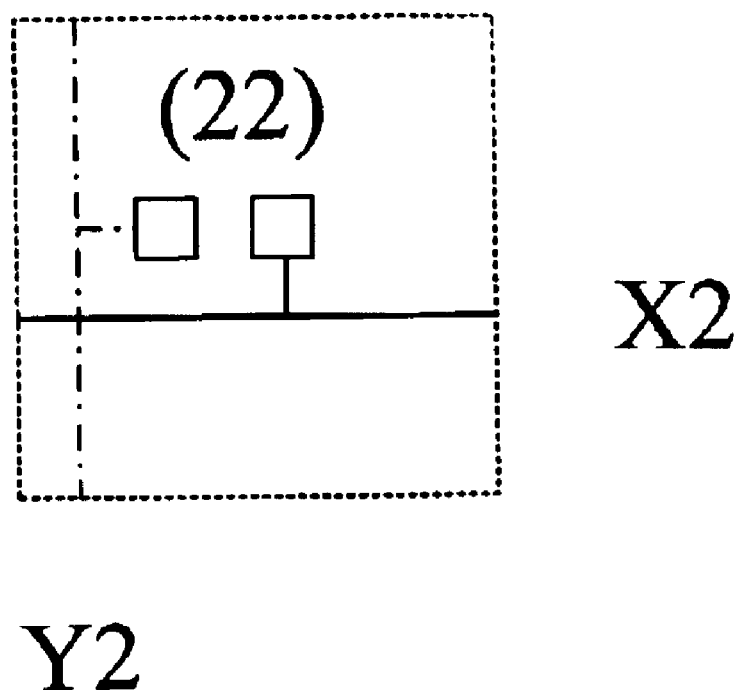
FIG. 8 shows a single LED pixel.

FIG. 8 shows a further reduction of the LED matrix to a single LED pixel. The LED (22) is energized by the coincident addressing of row X2 and column Y2. Conversely, if the LED (22) is found to be defective, this LED can be deactivated by disabling the address X2, Y2. Also, if one of the LEDs is defective, the display panel can be cut to a smaller sub-display panel.

Figure 9:
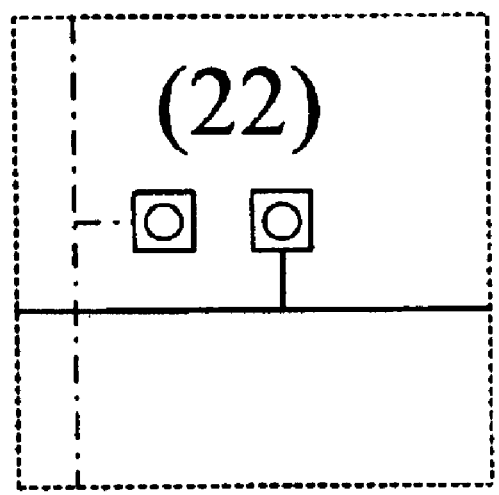
FIG. 9 shows plated-through soldering pads for mounting the LEDs.

FIG. 9 shows the bonding pads for insertion-type LEDs with two bottom electrodes. The LED (22) has one bottom electrode inserted in the left soldering pad with a plated-through via hole for connection to a vertical interconnection Y2 as described in FIG. 4. The second bottom electrode of the LED is inserted in the right-hand soldering pad, which is connected to the common horizontal interconnection X2.

Figure 10:
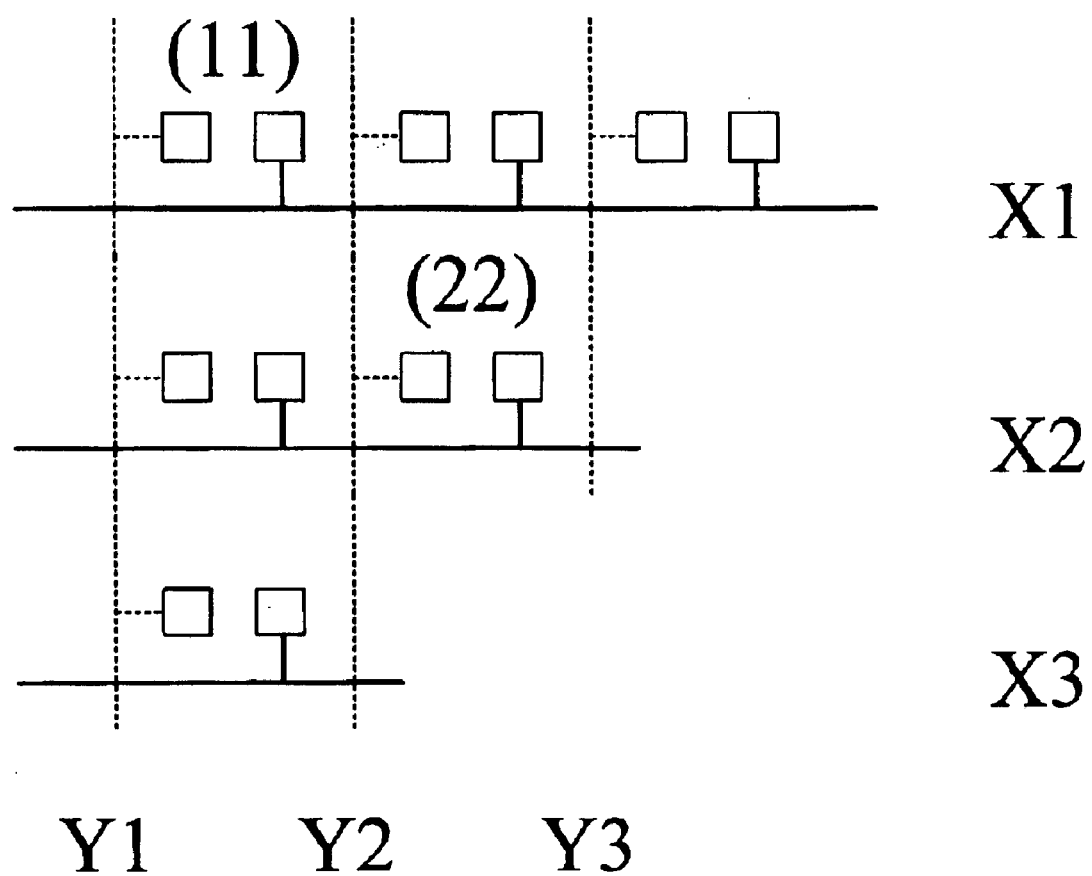
FIG. 10 shows mounting pads for LEDs with only bottom electrodes.

FIG. 10 shows another LED matrix panel which is cut to a non-rectangular display. As shown, row X1 has three LEDs such as (11), row X2 has two LEDs such as (22), and row X3 has only one LED. As before, the panel can be cut from the original 8×4 matrix array. Yet, the horizontal interconnections and/or vertical interconnections can be extended, because of the regularity of the layout patterns.

While the preferred embodiments of the invention have been described, it will be apparent to those skilled in the art that various modifications may be made in the embodiments without departing from the spirit of the present invention. Such modifications are all within the scope of this invention.

What is claimed is:

1. A random partitionable dot matrix light emitting diode (LED) display panel, comprising:

an insulating substrate;

an array of LEDs laid out as a dot matrix on said substrate, each LED having a first electrode and a second electrode;

a first soldering pad for each said first electrode and a second soldering pad for each said second electrode mounted on said substrate;

a first set of parallel interconnections printed on the front side of said substrate and each connected to all said first soldering pad for LEDs on a same row; and a second set of parallel interconnections printed on the backside of said substrate, orthogonal to and insulated from said first set of parallel interconnections, each connected to all said second soldering pad for LEDs on the same column, whereby each LED at a cross-point of said first set of parallel interconnections and said second set of parallel interconnections is activated by coincident addressing of one wire from said first set of parallel interconnections and another wire from said second set of parallel interconnections, and wherein each said second soldering pad is plated through said substrate and connected to one wire of said second set of parallel interconnections printed in the backside of said substrate.

2. The random partitionable dot matrix LED display panel as described in claim 1, wherein said array of LEDs is configured by cutting out at least one row of said LEDs.

3. The random partitionable dot matrix LED display panel as described in claim 1, wherein said array of LEDs is configured by cutting out at least one column of said LEDs.

4. The random partitionable dot matrix LED display panel as described in claim 1, wherein said array of LEDs configured by cutting out at least one row of said LEDs and at least one column of LEDs.

5. The random partitionable dot matrix LED display panel as described in claim 1, wherein any defective LED in said array is inactivated by disabling the interconnections addressing the defective LED.

6. The random partitionable dot matrix LED display panel as described in claim 1, wherein more than one LED in one said row is inactivated, and more than one LED in one said column is inactivated to display a dedicated display pattern.

7. The random partitionable dot matrix LED display panel as described in claim 1, wherein each one of said LEDs has a bottom electrode and a top electrode, and wherein said bottom electrode rests on said first soldering pad and said top electrode is wire-bonded to said second soldering pad.

8. The random partitionable dot matrix LED display panel as described in claim 1, wherein each one of said LEDs has a first bottom electrode and a second bottom electrode, and wherein said first bottom electrode rests on said first soldering pad, and said second bottom electrode rests on said second soldering pad.

9. The random partitionable dot matrix LED display panel as described in claim 1, further comprising more than one said partitioned dot matrix LED display panel pieced together by aligning and coupling corresponding said first set of interconnections and said second set of interconnections through a motherboard.

* * * * *